United States Patent [19]

Chism et al.

[11] Patent Number: 4,797,627

[45] Date of Patent: Jan. 10, 1989

[54] PROGRAMMATICALLY GENERATED IN-CIRCUIT TEST FOR GENERAL PURPOSE OPERATIONAL AMPLIFIERS

[75] Inventors: Wayne R. Chism, Greeley; Larry G. Smeins, Loveland, both of Colo.

[73] Assignee: Hewlett-Packard Company, Palo Alto, Calif.

[21] Appl. No.: 175,831

[22] Filed: Mar. 31, 1988

[51] Int. Cl.⁴ .............................................. G01R 27/00
[52] U.S. Cl. ...................................... 330/2; 324/57 R
[58] Field of Search ................. 330/2, 207; 324/57 R, 324/73 R, 158 R

[56] References Cited

U.S. PATENT DOCUMENTS 2,244,751  6/1941  Werrmann ...................... 324/57 R Primary Examiner—Gene Wan
Attorney, Agent, or Firm—William W. Cochran

[57] ABSTRACT

A device and process for programmatically generated and controlled in-circuit pin tests and gross functionality tests of operational amplifiers. The tests provide basic functionality verification of amplifier functions independent of other circuitry on the printed circuit board of which the operational amplifier is a component.

11 Claims, 4 Drawing Sheets

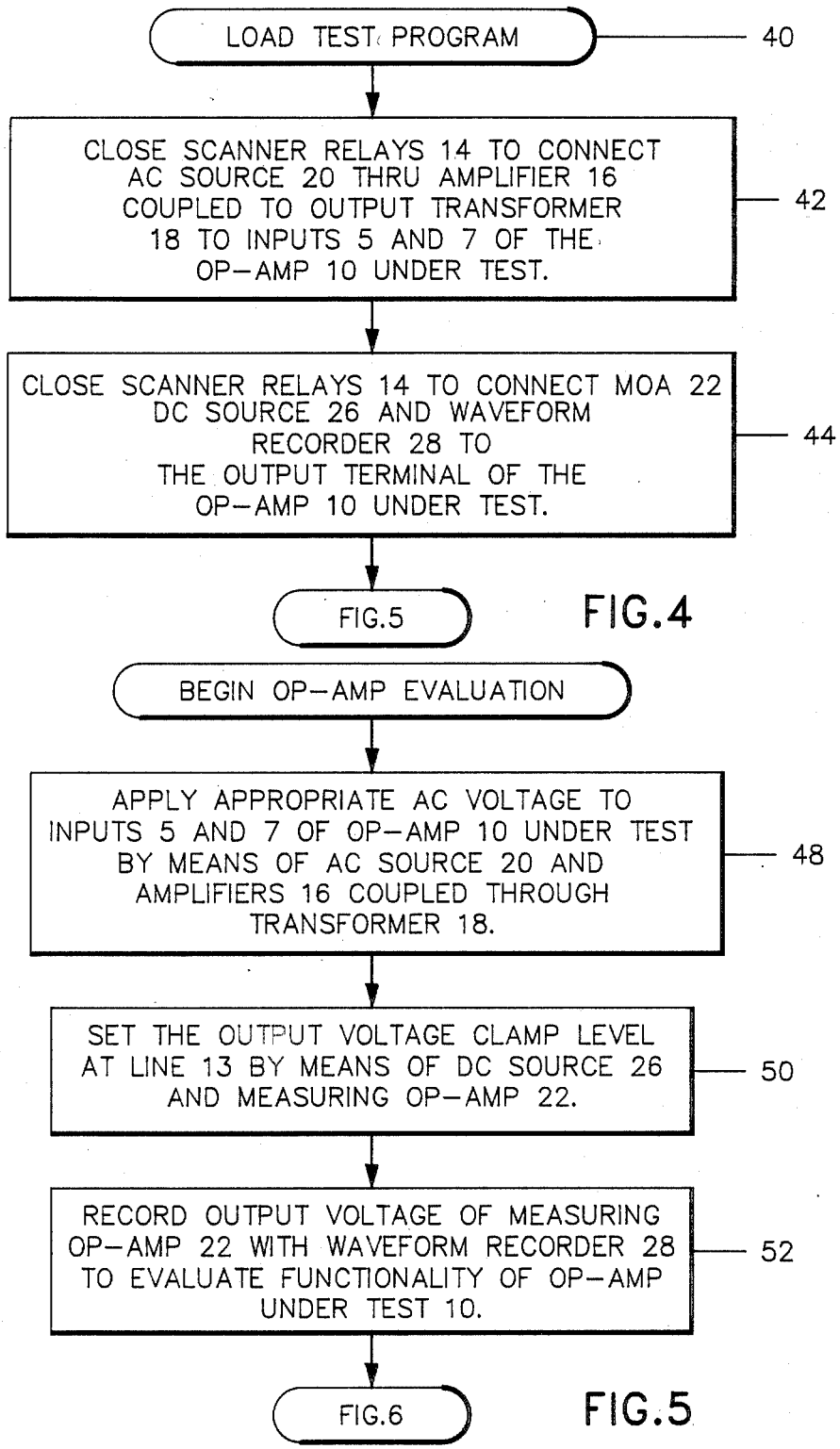

PROGRAMMATICALLY GENERATED IN-CIRCUIT TEST FOR GENERAL PURPOSE OPERATIONAL AMPLIFIERS

BACKGROUND OF THE INVENTION

A. Field of Invention

This invention pertains generally to the in-circuit functionality testing of active linear components; and more specifically to a device and procedure to provide for the in-circuit measurement and testing of general purpose operational amplifiers (op-amps).

B. Description of the Background

For this invention, in-circuit test or measurement refers to a printed circuit board test technique which, through the use of various isolation techniques, performs "pin checks" and "gross functionality tests" on individual operational amplifiers regardless of the specific circuit configuration or the effects of surrounding components. "Pin checks" refer to tests specifically designed to verify appropriate electrical activity on all device pins (the physical connections to the devices). "Gross functionality tests" are more comprehensive than pin checks and refer to tests designed to verify the basic function of the part in addition to simply verifying pin activity. Neither test provides a full functionality testing of the op-amp component specifications.

The proliferation of active linear electronic components, i.e. integrated circuits designed to perform such analog functions as amplification, voltage comparison, etc. has rendered standard in-circuit fault detection techniques obsolete, and created manufacturing and quality control problems for printed circuit board assemblies utilizing these devices. Central to this problem is the class of components known as operational amplifiers. Operational amplifiers are used in a multitude of amplification, integration, differentiation, and summing applications within general purpose analog designs. Conventional analog in-circuit test techniques (designed primarily to test passive components) will not suffice as a means of performing a comprehensive in-circuit functionality test of active components such as operational amplifiers. In addition, analog functional tests (those designed to test the operational amplifier and surrounding components as a functional block) are difficult to implement and do not provide good fault isolation diagnostics. As a result, printed circuit board assemblies utilizing operational amplifiers have been difficult to test, due to the previously intractable problem of programmatically generating in-circuit tests for these components independent of the effects from surrounding circuitry.

SUMMARY OF THE INVENTION

The present invention overcomes the disadvantages and limitations of the prior art by providing a device and methodology for the in-circuit functionality testing of operational amplifiers. This is accomplished by; electronically isolating the operation amplifier under test from its attendant circuitry (be means of low impedance direct input stimulus and output voltage clamping), programmatically stimulating the amplifier input with an appropriate analog waveform, and then evaluating the amplifier response by measuring its output current. Both sourcing and sinking currents can be measured in response to positive and negative input voltages respectively. Basic functionality testing of the operational amplifier with minimal overall circuit disruption is thus possible independent of the downstream and upstream circuitry surrounding the op-amp under test.

BRIEF DESCRIPTION OF THE DRAWINGS

FIG. 4 is a schematic flow diagram of the test setup procedure for testing a typical operational amplifier employing the test module in accordance with the present invention.

FIG. 5 is a schematic flow diagram of the procedure for testing a typical operational amplifier employing the test module in accordance with the present invention.

DETAILED DESCRIPTION OF THE INVENTION

Figure 1:
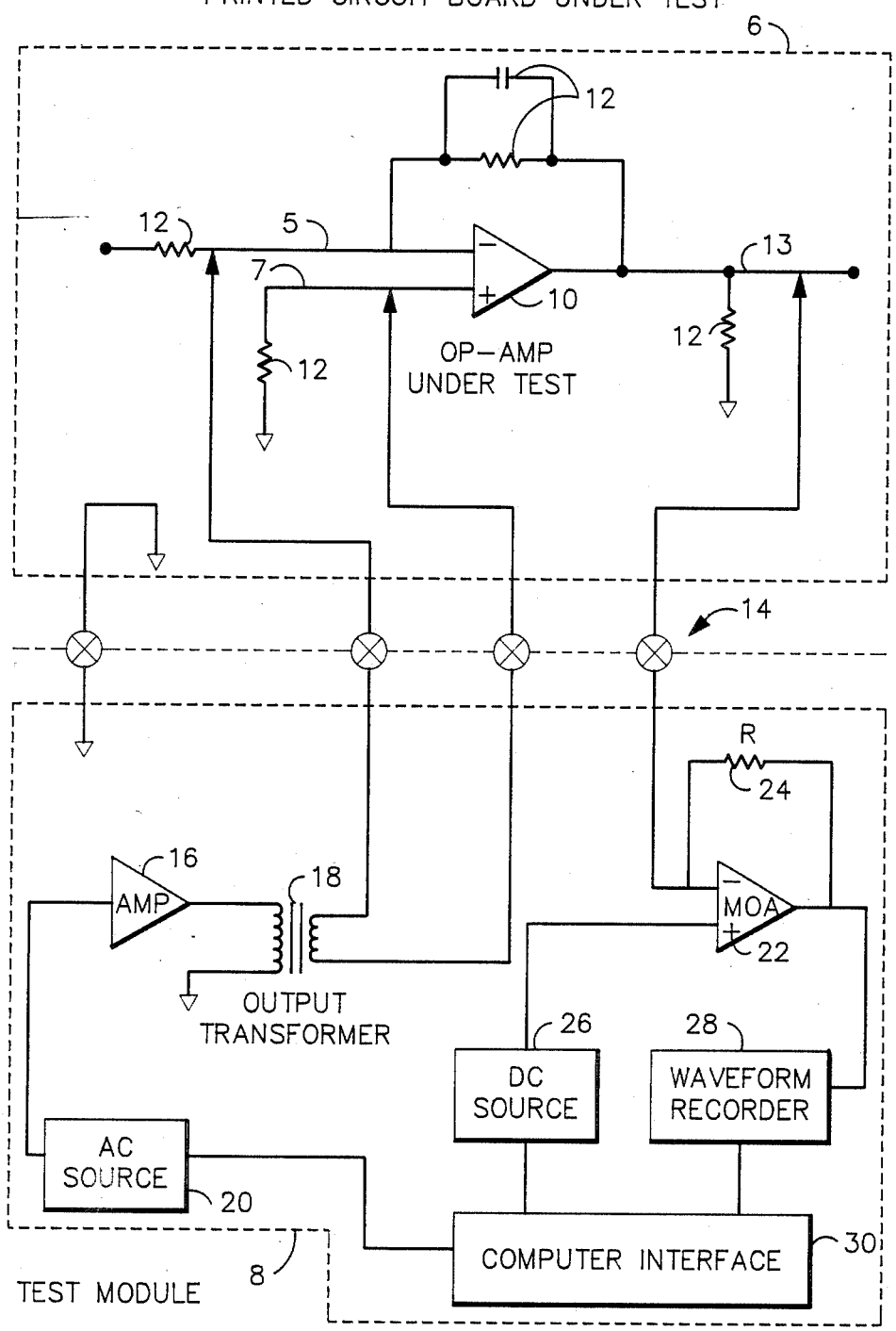
FIG. 1 is the schematic circuit diagram of the test module for testing an operational amplifier in a typical printed circuit board configuration in accordance with the present invention.

FIG. 1 discloses the schematic diagram of a test module 8 for performing programmatically generated incircuit "pin checks" and "gross functionality tests" of operational amplifier 10 which is one component of the printed circuit board assembly under test 6. The operational amplifier 10 is shown in a typical circuit configuration in conjunction with associated passive components 12. The test module 8 is driven through a computer interface 30 and test program generated for the specific operational amplifier being tested; and is interfaced to the printed circuit board under test 6 through a test fixture and scanner relays 14.

In order to perform an in-circuit test, the test module 8 must isolate the operational amplifier 10 under test from all surrounding circuitry 12, apply an appropriate stimulus to the amplifier 10 under test, and then make measurements to determine amplifier functionality. Isolation techniques are provided for the inverting (−) 5 and non-inverting (+) 7 analog inputs of the operational amplifier 10, as well as its analog output 13. Stimulus is applied to the analog inputs 5 and 7 of the op-amp 10 and measurements are made at the analog output 13 of the op-amp 10 in order to determine its functionality.

The analog input isolation and input stimulus signals are both provided by means of an AC source 20 in conjunction with an amplifier 16 with transformer coupled output 18. The transformer coupling is key to critical aspects of the test procedure. First, it provides AC coupling into the operational amplifier 10 under test which minimizes electronic perturbations at the input nodes by allowing the inputs to seek their own quiescent voltage as determined by the surrounding circuitry components 12. Secondly, the low output impedance of the transformer serves to hold the inverting (−) 5 and non-inverting (+) 7 terminals at the same DC potential which assists in the isolation process while at the same time permitting an AC input signal from the source 20 to be imposed directly at these opamp input terminals.

With this small AC voltage signal (on the order of 100 mV peak to peak, and at a frequency of between 100 Hz and 1 kHz) imposed directly at the inputs 5 and 7 of the operational amplifier 10, the output of the op-amp iill be driven into saturation (i.e.—maximum output voltage and/or current, depending on load) in both the positive and negative directions directly in response to the input AC waveform. This saturation condition may then be detected and evaluated against the specifications of the op-amp 10 under test in order to verify it functionality.

The circuitry used in the test module 8 to evaluate output saturation conditions of the operational amplifier 10 under test consists of a Measuring Operational Amplifier or MOA 22 and its associated feedback resistor 24, in conjunction with a DC voltage source 26 and a waveform recorder 28. The MOA 22 serves two purposes. First, it acts as an active clamp, effectively holding the output of the amplifier 10 under test at a fixed voltage as determined by the DC source 26. Fixing the output voltage of the op-amp 10 under test in this manner serves as an isolation technique for the op-amp 10 by preventing voltage changes at its output 13 from feeding back to the input through the surrounding circuitry 12 and disturbing the input 5 stimulus. The voltage level at which the output 13 is clamped is set by the DC source 26 and is determined by the specifications and application of the op-amp under test. It is usually set to a value midway between the two power supply voltages required by all operational amplifiers.

When the op-amp output voltage 13 is clamped at a fixed point, the amplifier 10 under test will alternately source and sink maximum current (its saturation response) in response to the stimulus at the (+) 7 and (−) 5 inputs. The second purpose of the MOA 22 is to convert this current into a voltage for measurement by the waveform recorder 28. The MOA, configured with its associated feedback resistor 24 performs this conversion function. The voltage measured at the waveform recorder 28 is thus directly proportional to the output current of the operational amplifier 10 under test.

The output voltage recorded is a square wave—with the positive peak corresponding to the maximum sourcing saturation current of the amplifier 10 under test, and its negative peak corresponding to the maximum sinking saturation current of the amplifier. From these measured voltages, the associated output currents are calculated and compared to the output current specifications of the specific operational amplifier 10 under test to verify its functionality.

Figure 2:
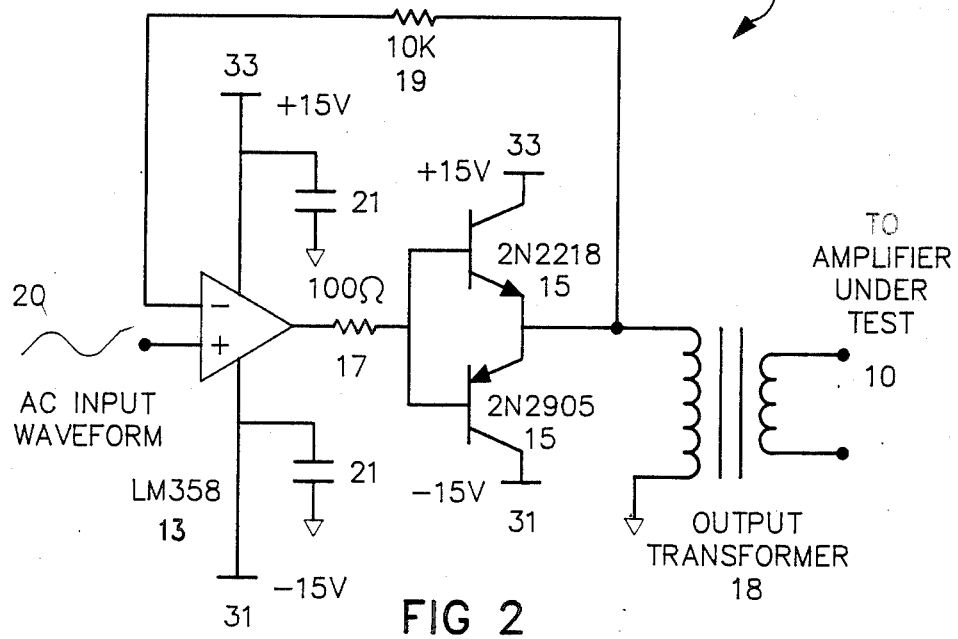
FIG. 2 is a circuit diagram schematic of the transformer coupled drive circuit, which provides input stimulus to the operational amplifier under test.

FIG. 2 discloses the transformer coupled drive circuit used for the input isolation and stimulus of the operational amplifier 10 under test. The circuit is a simple voltage follower with moderate drive current capability coupled to a step down output transformer. The LM 358 op-amp 13 drives a pair of emitter follower output transistors 15 which boost current drive capability. The 100 ohm resistor 17 and 10 k ohm feedback resistor 19 assure the stability of the circuit under varying load conditions. Bypass capacitors 21 are used at the +15 and −15 volt supplies 31 and 33 to damp current transients. The output transformer 18 provides AC coupling and a floating differential output, while the step down configuration further increases the current output capability and lowers the output impedance as seen by the operational amplifier 10 under test.

Figure 3:
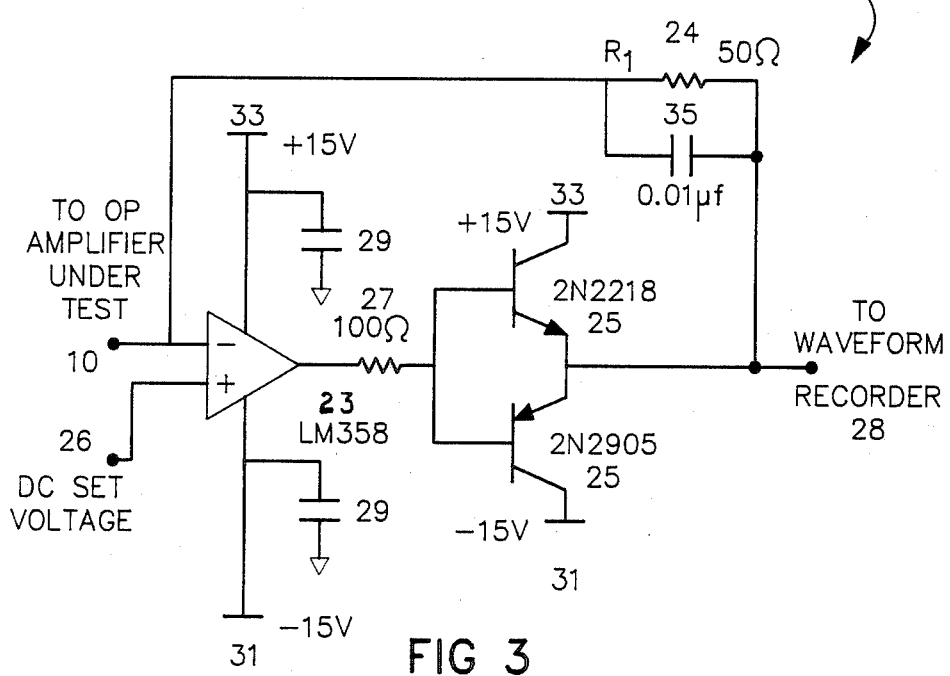
FIG. 3 is a schematic circuit diagram of the active clamp circuit used to stabilize the output voltage of the operational amplifier under test and measure its output current.

FIG. 3 discloses the measurement operational amplifier 22 (MOA) in an active clamp configuration as used for the output isolation and evaluation of the operational amplifier 10 under test. The LM358 op-amp 23 and associated emitter follower output transistors 25 make up the measurement op-amp 22 and provide moderate current output capability. This current capability is required to sink and source the maximum output current available from the operational amplifier under test in order to fix its output voltage at the desired set point (provided to the non-inverting input terminal (+) of the LM358). The 100 ohm resistor 27 assures emitter follower stability, and bypass capacitors 29 are used on the +15 and −15 volt supplies 31 and 33 to damp current transients. The 50 ohm feedback resistor 24 configures the MOA as a current to voltage follower while the associated 0.01 uF capacitor 35 assures circuit stability under varying load conditions. The relationship between the current from the operational amplifier under test and the output voltage sent to the waveform recorder is given by:

Output voltage=(Input Current) * (R1)

where R1 is the 50 ohm resistor 24 in the circuit.

This relationship permits the current levels to be calculated from the measured voltages at the waveform recorder.

FIG. 4 discloses a schematic flow diagram of the test set up procedure for configuring the test module of FIG. 1 for an in-circuit "pin check" and "gross functionality test" of an operational amplifier.

The test setup consists of loading the appropriate component test program in step 40 and making all electrical connections through scanner relays 14 to the operational amplifier 10 under test as shown in FIG. 1. In step 42, the AC source 20 is connected by means of amplifier 16 with transformer coupled output 18 to the input terminals 5 and 7 of the operational amplifier 10 under test. In the next step 44, the measuring operational amplifier 22 is configured as an active clamp and current to voltage converter; and the DC source 26; and the waveform recorder 28 are connected to the output of the operational amplifier under test 10.

FIG. 5 discloses the procedural steps for the evaluation of an operational amplifier 10 using the test module of FIG. 1. First, in step 48, an AC voltage is applied to the op-amp inputs 5 and 7 by means of the AC sourc 20 and amplifier 16 through transformer coupled output 18. Next, in step 50, the DC source 26 is set to the desired clamp voltage for the output 13 of the opamp under test 10 as determined by its specifications and specific test configuration. This is nominally set to a point midway between the positive and negative power supplies required by the operational amplifier 10. Finally, in step 52, the waveform recorder 28 is used to record the output response of the operational amplifier 10 under test. Here, the maximum and minimum levels recorded correspond to the maximum positive and negative current generated by the op-amp 10 under test. This information is then read back through the computer interface 30 for evaluation and comparison to expected results.

Figure 6:
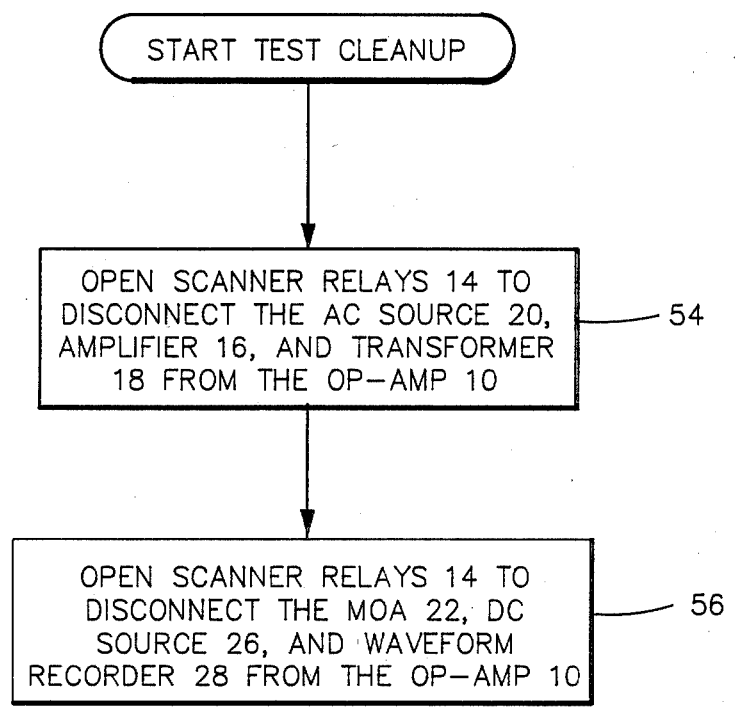
FIG. 6 is a schematic flow diagram of the test cleanup procedure for the test of a typical operational amplifier employed in accordance with the present invention.

Cleanup of the operational amplifier test setup is disclosed in FIG. 6. Here, in steps 54 and 56 all lines between the operational amplifier under test 10 and test module 8 are disconnected. This is accomplished by opening scanner relays 14.

The present invention therefore provides a unique means and method of programmatically generating in-circuit pin checks and gross functionality tests of operational amplifiers. These tests are independent of th circuit in which the amplifier resides and therefore the present invention provides a method for quality control in the manufacture of printed circuit boards containing these linear devices.

The foregoing description of the invention has been presented for purpose of illustration and description. It is not intended to be exhaustive or to limit the invention to precisely the form disclosed, as other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except a limited by the prior art.

What is claimed is:

1. A module for programmatically testing an operational amplifier that is connected to components in a circuit comprising:

alternating current voltage means for generating a precision alternating current signal for isolation and stimulation of said operation amplifier;

transformer coupled drive amplifier means for coupling said alternating current voltage means to said operational amplifier;

direct current voltage means for generating precision direct current signal;

measuring operational amplifier means with feedback resistor for clamping output voltage of said operational amplifier and converting output current of said op-amp to a voltage;

waveform recorder means for recording said output voltage of said operational amplifier comparator means for comparing said recorded output with expected results to provide an indication of functionality of said operational amplifier.

2. The module of claim 1 wherein said transformer coupled drive amplifier means comprises:

op-amp means for driving emitter follower transistors for boosting current;

resistor means for assuring circuit stability under varying load conditions;

bypass capacitor means for clamping current transients;

output transformer means for providing low impedance AC coupling at amplifier output.

3. The module of claim 1 wherein said measuring operational amplifier means comprises:

op-amp means for driving emitter follower transistors for clamping output voltage at a specific value;

resistor means for assuring transistor stability;

bypass capacitors means for damping current transients;

feedback resistor and associated capacitor means for configuring said measuring operational amplifier means as a current to voltage follower.

4. The module of claim 1 wherein said alternating voltage means comprises:

means for generating a range of +/−10.0 volts at a resolution of 3.0 mV with an accuracy of +/−0.1% and, a frequency range of 0.5 Hz to 20 kHz with a resolution of 0.5 Hz and an accuracy of +/−0.5%.

5. The module of claim 1 wherein said transformer coupled drive amplifier means comprises:

means for producing a DC transformer saturation current of greater than 10 mA at an output impedance of less than 0.50 ohms.

6. The module of claim 1 wherein said direct current voltage means comprises:

means for generating range of +/−10.0 volts at a minimum resolution of 3.0 mV and a accuracy of +/−0.1%

7. The module of claim 1 wherein said measurement operational amplifier means comprises:

means of producing an output voltage range of +/−10.0 volts, with a minimum output current of +/−150 mA, and an output resistance of less than 3.0 ohms.

8. The module of claim 1 wherein said waveform recorder means comprises:

means for recording an input voltage range of +/−10.0 volts with a minimum resolution of 3.0 mV, with an accuracy of +/−0.1% and a frequency response from DC to 10 kHz.

9. A process to programmatically perform incircuit pin checks and gross functionality tests of operational amplifiers using specific isolation, stimulation and measurement techniques comprising the steps of:

applying an appropriate voltage signal to inputs of said operational amplifier;

clamping an output of said operational amplifier to a desired voltage level;

recording output current of said operational amplifier;

evaluating said recorded output current with an expected response for said operational amplifier.

10. The process of claim 9, further comprising the steps of:

connecting an AC source to input terminals of said operational amplifier under test through an amplifier with a transformer coupled output;

connecting a measuring operational amplifier, a DC voltage source and a waveform recorder to said output terminal of said operational amplifier.

11. The process of claim 10, further comprising the steps of:

applying a predetermined AC voltage to said operational amplifier through said transformer coupled amplifier and an AC voltage source;

setting said DC voltage source to power said measuring operational amplifier to a desired clamp level at said output of said operational amplifier;

recording said output current response of said operational amplifier using a current to voltage converter and a waveform recorder;

evaluating said response with expected output as specified for said operational amplifier under test.

* * * * *

UNITED STATES PATENT AND TRADEMARK OFFICE
CERTIFICATE OF CORRECTION

PATENT NO. : 4,797,627

DATED : January 10, 1989

INVENTOR(S) : Wayne R. Chism
Larry G. Smeins

It is certified that error appears in the above-identified patent and that said Letters Patent is hereby corrected as shown below:

Column 3, line 5, "iill" should read -- will --;

Column 4, line 46, "sourc" should read -- source --;

Column 5, line 2, "th" should read -- the --;

Column 5, line 19, "a" should read -- as --;

Column 6, line 4 "resolution" should read -- minimum resolution --.

Signed and Sealed this

Seventeenth Day of October, 1989

Attest:

DONALD J. QUIGG

Attesting Officer

Commissioner of Patents and Trademarks